US006259261B1

(12) United States Patent
Engelking et al.

(10) Patent No.: US 6,259,261 B1
(45) Date of Patent: Jul. 10, 2001

(54) METHOD AND APPARATUS FOR ELECTRICALLY TESTING SEMICONDUCTOR DEVICES FABRICATED ON A WAFER

(75) Inventors: Steven Engelking; Richard Allan Deckert; Joey Dean Evans, all of San Antonio, TX (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 09/292,741

(22) Filed: Apr. 16, 1999

(51) Int. Cl.[7] ................................................... G01R 31/02
(52) U.S. Cl. ..................... 324/754; 324/158.1; 324/758; 324/765
(58) Field of Search .............................. 324/158.1, 754, 324/755, 761, 763, 758, 765

(56) References Cited

U.S. PATENT DOCUMENTS

| | | | |
|---|---|---|---|
| 4,884,024 | * 11/1989 | Diperna | 324/158.1 |
| 4,935,696 | * 6/1990 | Diperna | 324/158.1 |
| 5,485,096 | * 1/1996 | Aksu | 324/761 |
| 5,576,631 | * 11/1996 | Stowers et al. | 324/761 |
| 5,731,708 | * 3/1998 | Sobhani | 324/758 |
| 5,936,421 | * 8/1999 | Stowers et al. | 324/761 |
| 5,955,876 | * 9/1999 | Yamauchi et al. | 324/158.1 |
| 6,075,373 | * 6/2000 | Lino | 324/754 |

* cited by examiner

Primary Examiner—Safet Metjahic
Assistant Examiner—Jimmy Nguyen
(74) Attorney, Agent, or Firm—Ronald P. Kananen; Rader, Fishman & Grauer

(57) ABSTRACT

A probe head replaces the probe card conventionally used to electrically test circuits on semiconductor wafers. Within the probe head, an array of pins is biased in a retracted position. A corresponding array of leads is biased in an extended position. By clamping a selector card with one or more apertures between the pin array and the nail array allows selected leads to extend into contact with corresponding pins so as to extend those pins for use in testing a wafer. The selector card can be quickly replaced to obtain a different pin pattern in the probe head. The probe head is movably mounted so as to be positioned, and appropriately repositioned, with respect to the wafer being tested.

11 Claims, 4 Drawing Sheets

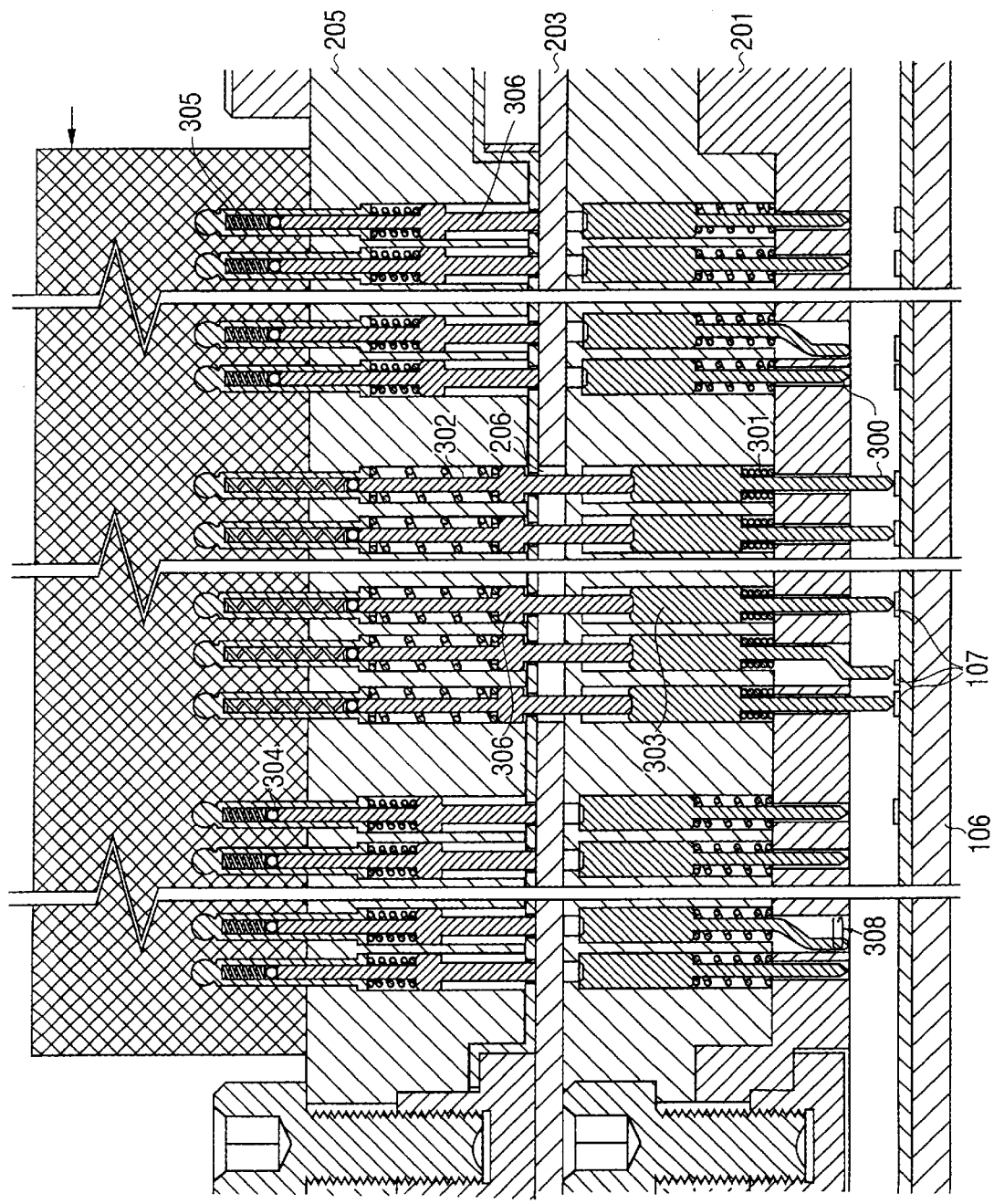

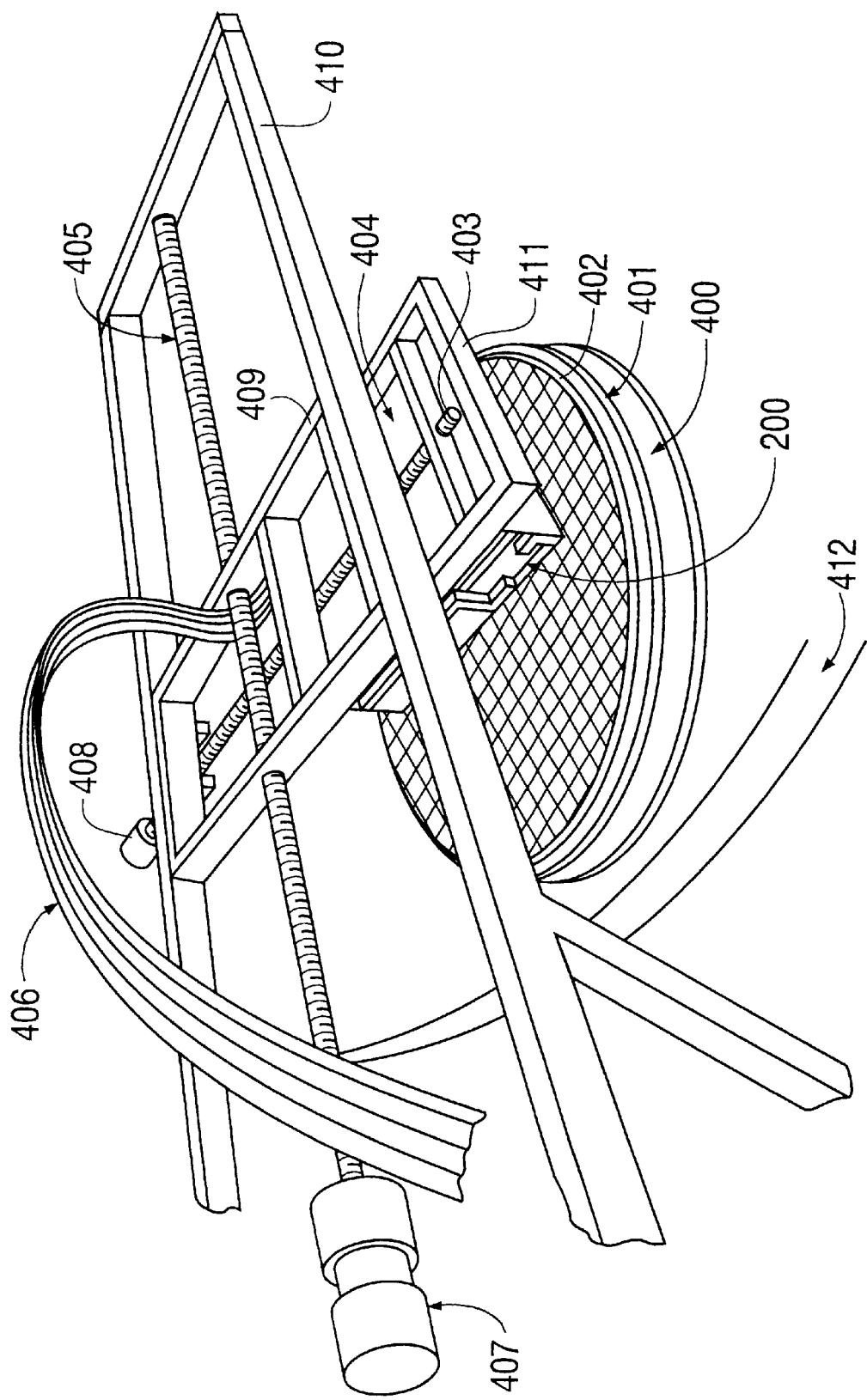

METHOD AND APPARATUS FOR ELECTRICALLY TESTING SEMICONDUCTOR DEVICES FABRICATED ON A WAFER

FIELD OF THE INVENTION

The present invention relates to the field of manufacturing semiconductor devices. More particularly, the present invention relates to the field of electrically testing electronic devices formed on a semiconductor wafer, especially prior to slicing the wafer into individual semiconductor chips.

BACKGROUND OF THE INVENTION

Microelectronic circuits formed on computer chips are used in an amazingly wide variety of applications. For example, computer chips are used to control fuel-injection systems in automobiles, to regulate thermostats heating homes, and to place calls with a wireless telephone.

Circuits and individual circuit elements are formed on a computer or semiconductor chip by repeatedly depositing and patterning layers of material on a semiconductor wafer. The wafer is then sliced into chips that are incorporated into many electronic devices.

After the semiconductor devices and electronic circuits are formed on a semiconductor wafer, but before the wafer is sliced into individual chips, it is the industry practice to electrically test the circuits on the wafer to ensure that they are functioning properly. Chips with malfunctioning circuits are marked and discarded.

Because the circuits and circuit elements formed on a wafer are microscopic, a robot called a prober is used to test the circuits on a semiconductor wafer. The typical prober includes a probe card with electric leads or probes which extend from the probe card in a pattern that corresponds to electrical contact points or pads on the wafer to be tested. The wafer is brought into contact with the leads of the probe card, thereby effectively plugging the circuit on the wafer into the prober through the probe card. Electrical currents or voltage potentials can then be applied through the leads of the probe card to the circuit on the wafer to test the circuit for proper operation.

A typical probe card is illustrated in FIG. 1. As shown in FIG. 1, the probe card includes an epoxy ring (103) around an inner periphery of an annular printed circuit board (101). A number of probe leads (104) are embedded within the epoxy ring (103). Each probe lead (104) is electrically connected to circuits on the printed circuit board (101) at one end (107), and angled into a probe tip (105) at the other end.

As described above, a wafer (106) being tested includes a number of contact pads (107) which are used to electrically connect the circuits on the wafer (106) to the prober through the probe leads (104) of the probe card. In conventional systems, the wafer (106) is moved in the XY plane to align the pads (107) with the probe tips (105). The wafer (106) is then raised to bring the pads (107) into contact with the probe tips (105).

There are a number of problems with this probe card arrangement and method of testing circuits on semiconductor wafers. For example, every time a different type of circuit is to be tested, the probe card on the tester must be replaced to provide a probe card with a pattern of probe leads (104) that corresponds to the pads (107) on the circuit to be tested. Replacing the probe card has traditionally been a difficult and time-consuming process.

Moreover, probe cards are expensive, and a large number of probe cards must be stored to account for the wide variety of possible lead patterns that may be needed to test the circuits being produced. Additionally, probe cards are fragile and difficult or impossible to repair if damaged.

Another problem arises from the procedure of positioning the wafer with respect to the probe leads prior to testing. The wafer must be positioned and repositioned repeatedly so as to test the large number of individual circuits on a single wafer. The wafer is typically held on a moving wafer chuck that positions the wafer for testing. The wafer chuck typically incorporates a vacuum system that holds the wafer in place with a vacuum applied thereto.

The wafer chuck, particularly a vacuum chuck, is a relatively cumbersome device. Therefore, excessive time and energy are expended in positioning and repositioning the wafer for testing. This bottleneck decreases the production capacity of current wafer testing systems.

Finally, a third problem arises in the mechanics of contacting the probe tips (105) with the contact pads (107). Due to the angle of the leads (105) and the further angle of the probe tips (105), when the contact pads (107) of the wafer (106) are pressed against the probe tips (105), there is some lateral movement of the probe tip (105) in the XY plane across the contact pad (107).

This results in wear to the probe tip (105) and scratching on the contact pad (107). Additionally, the pads (107) are frequently covered with coatings of aluminum oxide and organo-metallic debris. This material may be collected on the probe tip (105) as it scrubs over the pad surface (107). As the probe tip (105) becomes worn or collects material scratched from the contact pads (107), it may no longer make a proper electrical connection to the contact pads (107) or may make a false connection with a portion of the circuit being tested other than through the pad (107).

In some instances, circuits on wafers are heated prior to testing to simulate actual operating conditions. If the testing is done in an environment where heat is applied, the probe leads (104) may expand due to thermal expansion, thereby misaligning the probe tips (105) with the contact pads (107). The result may be a probe tip (105) that contacts the wafer (106) other than on the contact pad (107) thereby causing damage to the circuits or circuit elements on the wafer (106).

Consequently, there is a need in the art for a method and a device of testing circuits and circuit elements on semiconductor wafers that is easily modified to accommodate different contact pad patterns on the device being tested. There is a further need for a method and device for testing semiconductor wafers in which the relative positioning and repositioning of the wafer and the probe tips can be quickly and accurately accomplished. Finally, there is a need in the art for a method and device of testing semiconductor wafers in which the probe tips are not subject to a high degree of wear, the accumulation of material from the contact pads or misalignment due to the thermal expansion of a lead.

SUMMARY OF THE INVENTION

It is an object of the present invention to meet the above-described needs and others. Specifically, it is an object of the present invention to provide a method and a device of testing circuits and circuit elements on semiconductor wafers that is easily modified to accommodate different contact pad patterns on the device being tested. It is a further object of the present invention to provide a method and device for testing semiconductor wafers in which the relative positioning and repositioning of the wafer and the probe tips can be quickly and accurately accomplished. Additionally, it is an object of the present invention to provide a method and device for testing semiconductor wafers in which the probe tips are not subject to a high degree of wear, the accumulation of material from the contact pads or misalignment due to the thermal expansion of a lead.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve these stated and other objects, the present invention may be embodied and described as a probe head for electrically testing structures formed on a semiconductor wafer. The probe head of the present invention includes an array of pins which are biased in a retracted position; and a selector for selectively extending pins from the array of pins to form a pin pattern for testing the structures on a semiconductor wafer.

The selector of the present invention preferably includes an array of leads in a nailer block that correspond to the array of pins. The leads are biased in an extended position. A selector card with one or more apertures formed therein is disposed between the array of pins and the array of leads. Leads located at the aperture or apertures in the selector card extend through the selector card to contact, and thereby extend, corresponding pins.

The array of leads and the array of pins are disposed respectively in first and second portions of a frame. The first and second frame portions are movable with respect to each other so as to separate or draw together the array of leads and the array of pins. The frame also holds the selector card between the array of leads and the array of pins. Preferably, a clamp is provided on the frame for drawing the first and second frame portions together.

The present invention also preferably includes a probe head disposed on a moving carriage. The carriage positions the array of pins within a horizontal plane for testing the structures on the semiconductor wafer.

Preferably, the pins of the array of pins extend vertically such that when the pins are brought into contact with contact pads on a semiconductor wafer there is no tendency of the tips of the pins to move laterally with respect to the contact pads. This prevents the pin tips from scratching or accumulating material from the contact pads.

Preferably, the present invention also includes a wafer chuck for holding the semiconductor wafer. The chuck is moveable in a vertical direction to bring the wafer into contact with the pins of the probe head. For maximum production, the wafer chuck may be mounted on a rotating table.

BRIEF DESCRIPTION OF THE DRAWINGS

The accompanying drawings illustrate the present invention and are a part of the specification. Together with the following description, the drawings demonstrate and explain the principles of the present invention.

FIG. 3 is an illustration of a cross section of the probe head assembly of FIG. 2, according to the principles of the present invention; and FIG. 4 is an illustration of a prober incorporating the probe head of FIG. 2, according to the principles of the present invention.

DETAILED DESCRIPTION OF THE PREFERRED EMBODIMENTS

Using the drawings, the preferred embodiments of the present invention will now be explained.

Figure 1:
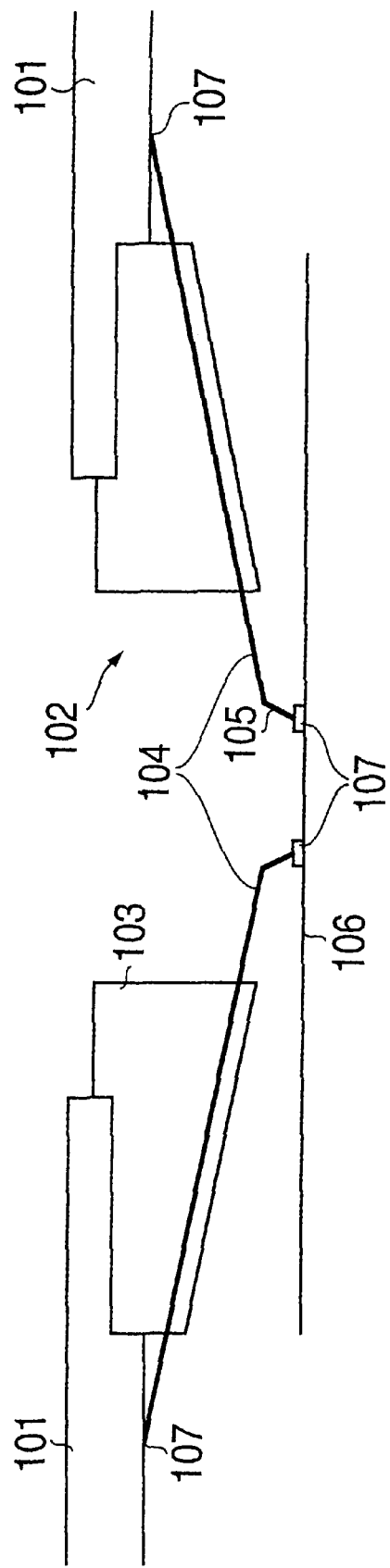
FIG. 1 is an illustration of a probe card according to the prior art.
Figure 2:
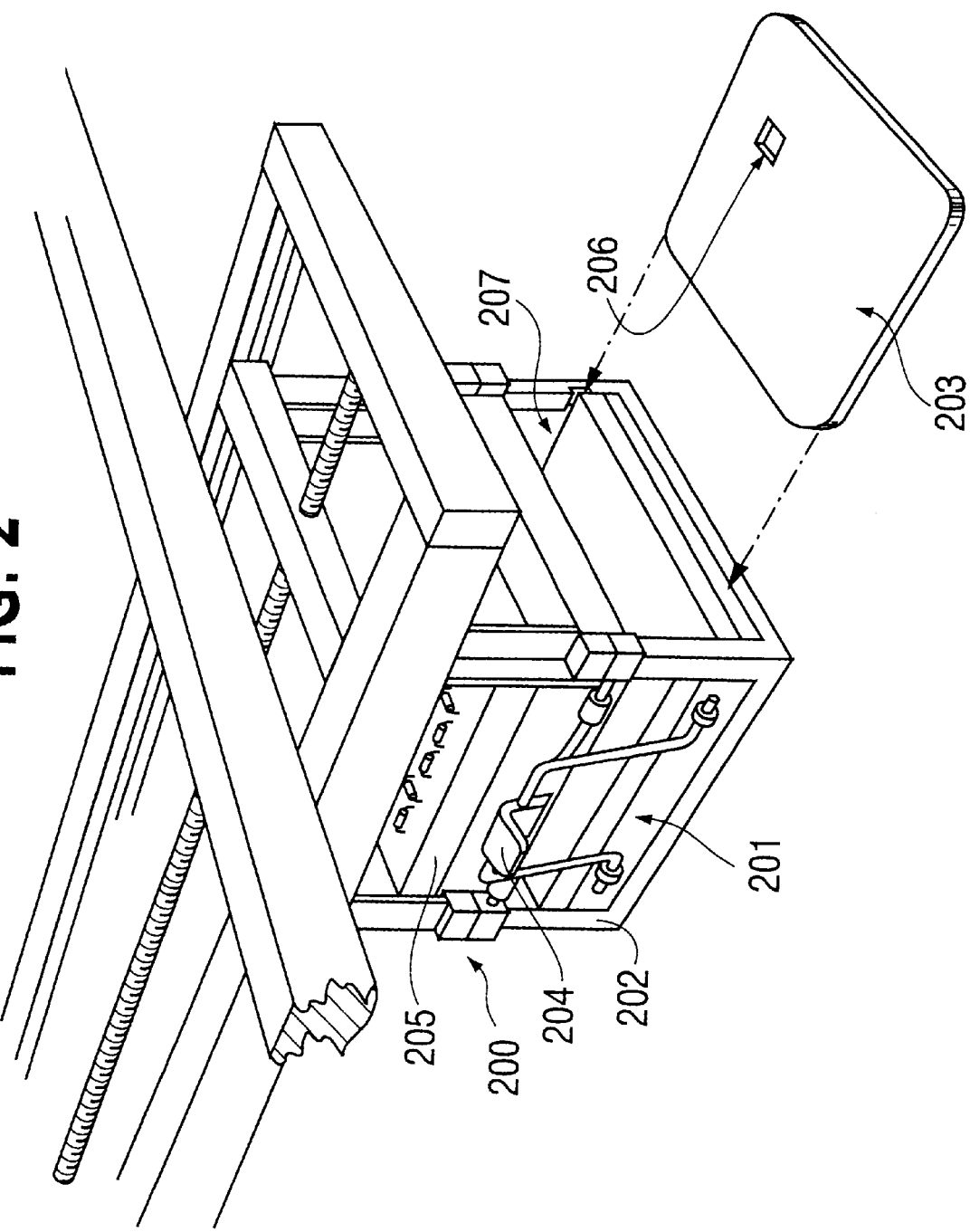
FIG. 2 is an illustration of a probe head assembly according to the present invention.

Under the principles of the present invention, the conventional probe card is completely replaced with an assembly called a probe head. FIG. 2 illustrates an example of a probe head (200) according to the present invention.

As shown in FIG. 2, the probe head (200) of the present invention includes a pin block (201) and a nailer block (205). The pin block (201) and the nailer block (205) are arrays of spring-loaded electrical pins and leads for making selective electrical connections with the contact pads of a semiconductor device on a wafer.

A cross section of the probe head (200), including the pin block (201) and the nailer block (205), is illustrated in FIG. 3. As shown in FIG. 3, the pin block (201) is an array of spring-loaded electrical pins (303) each of which ends in a probe tip (300). Each pin (303) is biased by a spring (301) in a retracted position wholly inside the pin block (201).

Above the pin block (201) is the nailer block (205). As shown in FIG. 3, the nailer block (205) includes an array of spring-loaded leads or "nails" (306) that correspond to the pins (303) of the pin block (201). In contrast to the pins (303) of the pin block (201), the leads (306) of the nailer block are biased in an extended position in which each lead (306) extends out of the nailer block (205). Preferably, the leads (306) are each biased in the extended position by a lower spring (302).

A ball (304) may be used between an upper spring (305) and the lead (306). The ball (304) is the point at which electrical contact is made between the lead (306) and circuits on a printed circuit board (404) which, in turn, connect to the test circuitry of the prober through a cable (406). The upper spring (305) is used primarily to ensure constant electrical contact between the ball (304) and its respective lead (306).

The extending bias of the leads (306) due to the spring (302) is greater than the retracting bias on the pins (303). Consequently, when the probe head (200) of the present invention is assembled, in those locations where the leads (306) are allowed to extend under the bias of the spring (302), a corresponding pin (303) is caused to extend from the bottom of the pin block (201) against the bias of spring (301). In other words, the extending lead (306) contacts the upper portion of the pin (303) and pushes the pin (303) against the bias of spring (301) to extend that pin below the pin block (201). A group of extended leads (306) and pins (303) are illustrated in the center of FIG. 3.

When extended, the probe tips (300) of the extended pins (303) can be brought into contact with the contact pads (107) on a wafer (106) of a semiconductor device or circuit to be tested. The probe tip (300), pin (303), lead (306) and ball (304) form an electrical path through which electrical signals can be applied to, and received from, the contact pads (107) so as to test the functioning of the circuits on the wafer (106).

Because the pins (303) are rigid and extended vertically along a vertical axis, there is no force on the probe tips (300) to move laterally over the contact pads (107). Consequently, the probe tips (300) do not scratch the contact pads (107) as in the conventional systems described above. Therefore, there is less wear on the probe tips (300), less accumulation of material on the probe tips (300) and less chance of a false or faulty connection to the contact pads (107). Moreover, there is less likelihood of damage to the contact pads (107) and the surrounding semiconductor structures from the testing.

As illustrated in FIG. 3, some probe tips (300) may include an angled portion (308) so as to accommodate relatively closely spaced contact pads (107) on the wafer (106). However, as will be clear to those in the art, the rigidity of the tip (300) and the placement of the angled portion (308) with respect to the axis along which the tip (300) moves prevent any relative movement between the tip (300) and the contact pad (107).

In between the nailer block (205) and the pin block (201), a selector card (203) is inserted. The selector card (203) includes one or more apertures (206) which allow the leads (306) to contact and extend the pins (303). Again, this is illustrated in the central portion of FIG. 3.

Other than at the aperture (206), the selector card (203) holds the leads (303) in a retracted position against the bias of the springs (302). Where the leads (303) are held in a retracted position, the corresponding pins (303) are also retained in a retracted position under the bias of the springs (301).

Consequently, by selecting the locations of the apertures in the selector card (203), the location of pins (303) extending to the contact pads (107) on the wafer (106) can also be selected. This provides two significant advantages of the present invention.

First, if the probe tips (300) of the pins (303) at a particular portion of the pin block (201) become worn and unusable, a different set of unworn pins (303) can be brought into service by simply replacing or reorienting the selector card (203). A replacement selector card would have an aperture or apertures in a different location allowing leads (306) to extend an unworn set of pins (303) for use.

Second, when a different type of circuit is to be tested by the prober, and a different configuration of pins (303) is called for corresponding to the contact pads (107) of the new circuit to be tested, the selector card (203) can be replaced with a different selector card having apertures in a pattern corresponding to the pattern of pins needed to test the circuit or circuit element in question.

The replacement of the selector card (203) will now be explained with reference to FIG. 2. As shown in FIG. 2, the probe head (200) of the present invention includes a frame (202) in which the nailer block (205) and the pin block (201) are mounted. The pin block (201) is mounted to a lower portion of the frame (202) which slides vertically with respect to the upper portion of the frame (202).

A locking clamp (204) is provided for raising the pin block (201) and the lower portion of the frame (202) and locking them in position against the nailer block (205). The selector card (203) is inserted in between the nailer block (205) and the pin block (201) when the clamp (204) is opened and the lower portion of the frame (202) is in a lowered position. Above the pin block (201), the frame (202) preferably includes guides (207) in which the selector card (203) is inserted.

With the proper selector card (203) inserted, the clamp (204) is closed. The closing of the clamp (204) raises the lower portion of the frame (202) and forces the selector card (203) against the nail block (205). Where there are apertures in the selector card (203), the leads will extend and push corresponding pins into an extended position. At portions other than where there are apertures in the selector card (203), the action of the clamp (204) will force the selector card (203) against the leads, holding the leads in a retracted position against the bias on the leads. Corresponding pins will retain a retracted position under the bias on the pins.

Finally, FIG. 4 illustrates a prober incorporating the probe head (200) of the present invention. As noted above, it is relatively difficult to use a vacuum wafer chuck to position a wafer with respect to the pins on a prober for testing. Consequently, under the principles of the present invention, the wafer (402) is disposed on a wafer plate (401) on a wafer chuck (400). The only motion of the wafer chuck (400) is in the vertical direction to raise the wafer (402) into contact with the probe head (200).

The probe head (200) is mounted on a carriage (411) that moves within two orthogonal frames (410) and (409). A pin screw (405) is driven by a first motor (407) so as to move the carriage (411) along a first axis. A second pin screw (403) is driven by a second motor (408) so as to move the carriage (411) along a second axis, perpendicular to the first axis. In this manner, the probe head (200) can be positioned at any XY coordinates with respect to the wafer (402) so as to test structures on the wafer (402).

A printed circuit board (404) may be provided above the probe head (200). The individual leads (306) are electrically connected to the circuit board (404) through the balls (304). A flexible cable (406) is then connected between the circuit board (404) and the prober's computer (not shown) so that the test signals and results can be provided to and from the circuits on the wafer, respectively.

Additionally, the inventors listed herein have also created a novel system for increasing the speed with which semiconductor wafers are tested, both electrically with a prober and optically with optical inspection equipment. That system also provides for the marking of defective dies or chips on a wafer. That system is disclosed and claimed in U.S. Pat. No. 6,137,303 filed Dec. 14, 1998 (incorporated herein by reference).

A principal innovation in that system is to provide a circular rotating table with wafer chucks located around the periphery. As the table rotates, the wafer chucks and the wafers thereon are successively brought into a series of processing stations including at least one electrical testing station incorporating a prober, an optical inspection station, a marking station, and a mark curing station.

It should be noted that, as shown in FIG. 4, the probe head of the present invention could be incorporated into the system of U.S. Pat. No. 6,137,303. For example, the wafer chuck (400) may be disposed on a rotating table (412) which rotates the wafer chuck (400) and wafer (402) under the probe head (200) of the present invention. The wafer chuck (400) then elevates to bring the wafer (402) into electrical contact with the properly positioned probe head (200) for electrical testing.

When testing is completed, the table (412) rotates the wafer (402) to another station, e.g. an optical inspection station. The rotation of the table (412) also brings a different wafer chuck and wafer under the probe head (200) for electrical testing. In this manner, the electrical testing and inspection of semiconductor devices can be greatly expedited.

The preceding description has been presented only to illustrate and describe the invention. It is not intended to be exhaustive or to limit the invention to any precise form disclosed. Many modifications and variations are possible in light of the above teaching.

For example, piezoelectric, pneumatic, hydraulic or other equivalent elements could be used as a selector in place of the nailer block (205) with biased leads (306) to selectively extend the pins (303) of the pin block (201).

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A probe head for electrically testing structures formed on a semiconductor wafer, the probe head comprising:
    an array of pins which are biased in a retracted position; and
    a selector for selectively extending pins from said array of pins to form a pin pattern for testing said structures on a semiconductor wafer, said selector comprising:
        an array of leads corresponding to said pins, wherein said leads are biased in an extended position, and
        a selector card having one or more apertures therein, wherein said selector card is disposed between said array of pins and said array of leads such that leads located at said aperture or apertures extend to contact, and thereby extend, corresponding pins.

2. The probe head of claim 1, wherein said array of leads and said array of pins are disposed respectively in first and second portions of a frame, said first and second frame portions being movable with respect to each other so as to separate or draw together said array of leads and said array of pins while holding said selector card therebetween.

3. The probe head of claim 2, further comprising a clamp on said frame for drawing said first and second frame portions together.

4. The probe head of claim 1, further comprising a moving carriage on which said array of pins is mounted, said carriage positioning said array of pins within a horizontal plane for testing said structures.

5. The probe head of claim 1, wherein said pins of said array of pins extend vertically such that when said pins are brought into contact with contact pads on a semiconductor wafer there is no tendency of tips of said pins to move laterally with respect to said contact pads.

6. A method of electrically testing structures formed on a semiconductor wafer, the method comprising the steps of:
    biasing an array of leads, corresponding to an array of pins, in an extended position;
    placing a selector card having one or more apertures therein between said array of leads and said array of pins such that leads located at said aperture or apertures extend to contact, and thereby extend, corresponding pins; and
    selectively extending said contacted pins from an array of pins, each of which is biased in a retracted position, to form a pin pattern for testing said structures on a semiconductor wafer.

7. The method of claim 6, further comprising mounting said array of leads and said array of pins respectively in first and second portions of a frame, said first and second frame portions being movable with respect to each other so as to separate or draw together said array of leads and said array of pins while holding said selector card therebetween.

8. The method of claim 7, further comprising drawing said first and second frame portions together and holding said first and second frame portions together with a clamp disposed on said frame.

9. The method of claim 6, further comprising moving carriage on which said array of pins is mounted to position said array of pins within a horizontal plane for testing said structures.

10. The method of claim 6, further comprising extending said pins of said array of pins vertically such that when said pins are brought into contact with contact pads on a semiconductor wafer there is no tendency of tips of said pins to move laterally with respect to said contact pads.

11. A probe head for electrically testing structures formed on a semiconductor wafer, the probe head comprising:
    an array of pins which are biased in a retracted position; and
    a selection means for selectively extending pins from said array of pins to form a pin pattern for testing said structures on a semiconductor wafer, said selection means including:
        an array of leads corresponding to said array of pins, wherein said leads are biased in an extended position; and
        a selector card having one or more apertures therein, wherein said selector card is disposed between said array of pins and said array of leads such that leads located at said aperture or apertures extend to contact, and thereby extend, corresponding pins.

* * * * *